(12) United States Patent
Cao et al.

(10) Patent No.: US 9,704,965 B1
(45) Date of Patent: Jul. 11, 2017

(54) SEMICONDUCTOR DEVICE WITH SELF-ALIGNED CARBON NANOTUBE GATE

(71) Applicant: INTERNATIONAL BUSINESS MACHINES CORPORATION, Armonk, NY (US)

(72) Inventors: Qing Cao, Yorktown Heights, NY (US); Shu-Jen Han, Cartlandt Manor, NY (US); Ning Li, White Plains, NY (US); Jianshi Tang, Elmsford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/277,291

(22) Filed: Sep. 27, 2016

(51) Int. Cl.
*H01L 29/49* (2006.01)
*H01L 29/66* (2006.01)
*H01L 29/51* (2006.01)
*H01L 21/28* (2006.01)
*H01L 21/265* (2006.01)
(Continued)

(52) U.S. Cl.
CPC .... *H01L 29/4966* (2013.01); *H01L 21/26513* (2013.01); *H01L 21/28088* (2013.01); *H01L 21/32056* (2013.01); *H01L 29/0847* (2013.01); *H01L 29/517* (2013.01);
(Continued)

(58) Field of Classification Search
CPC .............. H01L 21/28088; H01L 29/66568
See application file for complete search history.

(56) References Cited

U.S. PATENT DOCUMENTS 6,852,582 B2    2/2005  Wei et al.
7,632,762 B2   12/2009  Tiano et al.
(Continued)

FOREIGN PATENT DOCUMENTS

CN     101740719 B    12/2011
KR     101487443 B1    1/2015
(Continued)

OTHER PUBLICATIONS

Park, et al. "High-density integration of carbon nanotubes via chemical self-assembly", Nature Nanotechnology, 7, 787-791 (2012).

*Primary Examiner* — Moazzam Hossain
*Assistant Examiner* — Farun Lu
(74) *Attorney, Agent, or Firm* — Cantor Colburn LLP; Vazken Alexanian

(57) ABSTRACT

A method of forming a semiconductor device includes forming a channel layer on a substrate. A gate dielectric is deposited on the channel layer, and a mask is patterned on the gate dielectric. An exposed portion of the gate dielectric is removed to expose a first source/drain region and a second source/drain region of the channel layer. A first source/drain contact is formed on the first source/drain region and a second source/drain contact is formed on the second source/drain region. A cap layer is formed over the first source/drain contact and the second source/drain contact, and the mask is removed. Spacers are formed adjacent to sidewalls of the first source/drain contact and the second source/drain contact. An oxide region is formed in the cap layer and a carbon material is deposited on an exposed portion of the gate dielectric.

13 Claims, 12 Drawing Sheets

(51) Int. Cl.
  *H01L 29/08*   (2006.01)
  *H01L 29/78*   (2006.01)
  *H01L 21/3205* (2006.01)

(52) U.S. Cl.
  CPC .... *H01L 29/6656* (2013.01); *H01L 29/66568* (2013.01); *H01L 29/78* (2013.01)

(56) References Cited

U.S. PATENT DOCUMENTS

| | | |
|---|---|---|
| 7,714,386 B2 | 5/2010 | Pesetski et al. |
| 2014/0001542 A1 | 1/2014 | Franklin et al. |
| 2014/0004666 A1 | 1/2014 | Franklin et al. |
| 2016/0190244 A1* | 6/2016 | Lee ................ H01L 29/778 257/29 |
| 2016/0351643 A1* | 12/2016 | Xie ................ H01L 21/77 |

FOREIGN PATENT DOCUMENTS

| | | |
|---|---|---|
| KR | 1020150000043 A | 1/2015 |
| KR | 101499075 B1 | 2/2015 |
| KR | 1020150017035 A | 2/2015 |

* cited by examiner

SEMICONDUCTOR DEVICE WITH SELF-ALIGNED CARBON NANOTUBE GATE

BACKGROUND

The present invention relates to field-effect transistors. More specifically, the present invention relates to field-effect transistors with self-aligned carbon nanotube gates.

Transistor scaling over the past few decades has brought about some benefits in terms of device performance and effective cost. For example, the transistor operating frequency (e.g., cut-off frequency) can be increased by scaling down the gate/channel length, which satisfies the demand of making transistors that can be operated at high frequency for various applications.

Due to lithography process limitations, reducing a gate length in a field effect transistor down to the size of a few nanometers can present a challenge. Dimensional limits control the size of circuit elements used in a semiconductor chip, and thus how many circuits can be formed in a given amount of real estate (circuit density). This in turn affects the cost of integrated circuits as well as the speed at which the circuits can operate and how much power is needed to operate an integrated device.

SUMMARY

According to an embodiment of the present invention, a method of forming a semiconductor device includes forming a channel layer on a substrate. A gate dielectric is deposited on the channel layer, and a mask is patterned on the gate dielectric. An exposed portion of the gate dielectric is removed to expose a first source/drain region and a second source/drain region of the channel layer. A first source/drain contact is formed on the first source/drain region and a second source/drain contact is formed on the second source/drain region. A cap layer is formed over the first source/drain contact and the second source/drain contact, and the mask is removed. Spacers are formed adjacent to sidewalls of the first source/drain contact and the second source/drain contact. An oxide region is formed in the cap layer and a carbon material is deposited on an exposed portion of the gate dielectric.

According to another embodiment of the present invention, a method of forming a semiconductor device includes forming a channel layer on a substrate. A gate dielectric is deposited on the channel layer. An exposed portion of the gate dielectric is removed to expose a first source/drain region and a second source/drain region of the channel layer. A first source/drain contact is formed on the first source/drain region and a second source/drain contact is formed on the second source/drain region. A cap layer is formed over the first source/drain contact and the second source/drain contact. Spacers are formed adjacent to sidewalls of the first source/drain contact and the second source/drain contact. A carbon material is deposited on an exposed portion of the gate dielectric.

According to another embodiment of the present invention, a method of forming a semiconductor device includes forming a channel layer on a substrate. A gate dielectric is deposited on the channel layer and a mask is patterned on the gate dielectric. An exposed portion of the gate dielectric is removed to expose a first source/drain region and a second source/drain region of the channel layer. A first source/drain contact is formed on the first source/drain region and a second source/drain contact is formed on the second source/drain region. A cap layer is formed over the first source/drain contact and the second source/drain contact, and the mask is removed. Spacers are formed adjacent to sidewalls of the first source/drain contact and the second source/drain contact. An oxide region is formed in a portion of the cap layer and a carbon material is deposited on an exposed portion of the gate dielectric.

According to yet another embodiment of the present invention, a semiconductor device includes a gate arranged on a substrate, the gate includes a dielectric layer and a carbon material arranged on the dielectric layer. A source/drain region is arranged on the substrate, the source/drain region includes a doped semiconductor region. Spacers are arranged on the dielectric layer, the spacers are arranged along opposing sidewalls of a source/drain contact.

DETAILED DESCRIPTION

Due to lithography process limitations, reducing the gate length to a few nanometers can be challenging. Carbon nanotubes (CNTs) can be sorted and separated according to their physical properties such as different diameters and metallic or semiconducting properties. Besides conventional applications as the channel material for transistors, CNTs could also be used as the gate electrode. Chemically self-assembled carbon nanotubes can be used as gate electrodes for field-effect transistors to achieve ultra-short gate lengths as the diameter of a carbon nanotube can be as small as ~1 nm. Therefore, field-effect transistors with ultra-short gate length can be made that have a high cut-off frequency.

FIGS. 1-12 illustrate an exemplary method for forming an exemplary semiconductor device.

Figure 1:
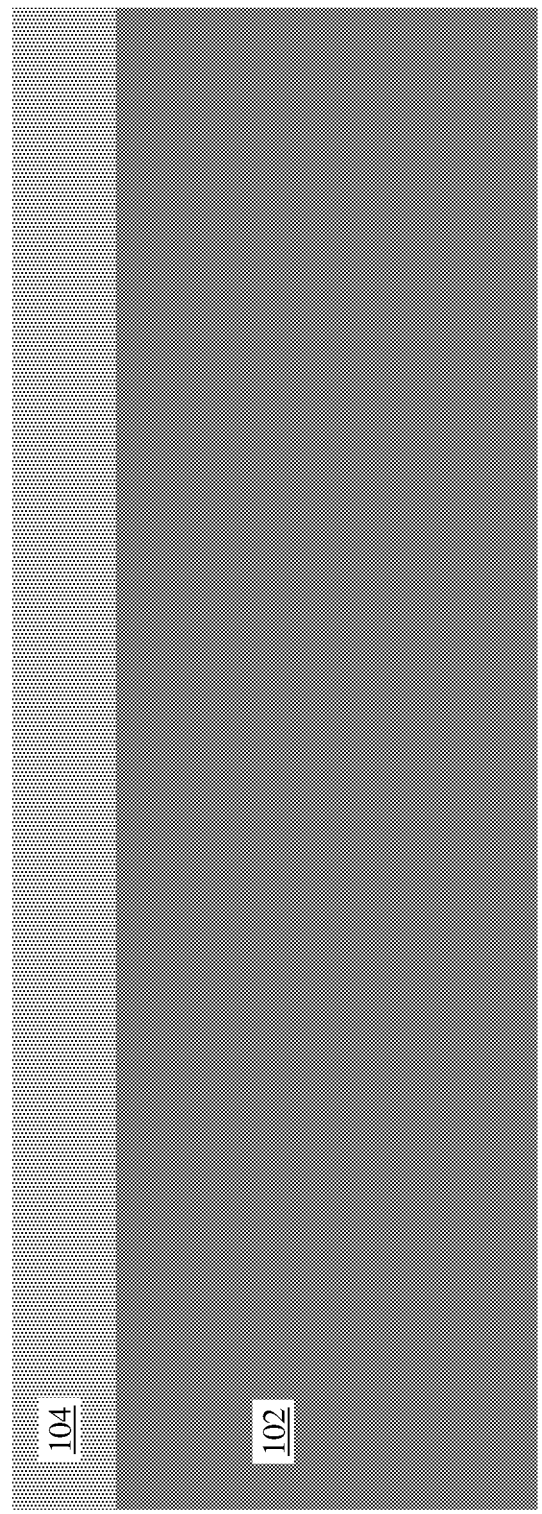
FIG. 1 depicts a side view of a substrate and a semiconductor channel material layer arranged on the substrate.

FIG. 1 illustrates a side view of a substrate 102 and a semiconductor channel material layer (active layer) 104 arranged on the substrate 102.

Non-limiting examples of suitable materials for the substrate 102 and/or the semiconductor channel material layer 104 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor substrate and channel material layer include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

Figure 2:
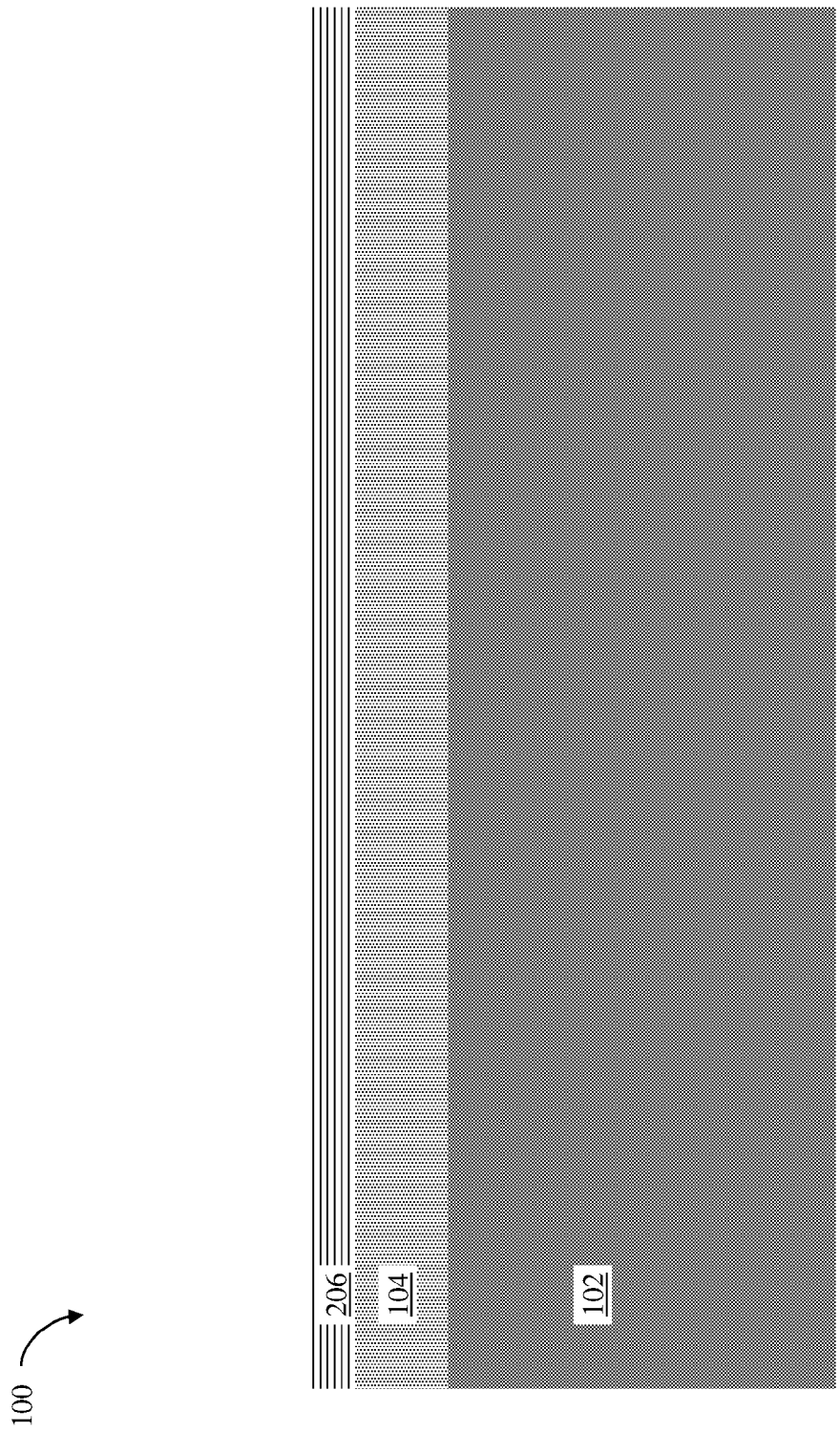
FIG. 2 illustrates a side view following the formation of a gate dielectric layer deposited on the channel material layer.

FIG. 2 illustrates a side view following the formation of a gate dielectric layer (e.g., high-K dielectric) 206 deposited on the channel material layer 104. Any composition and manner of forming the gate dielectric 206 can be utilized. In some embodiments, the gate dielectric 206 is conformally formed over exposed portions of the channel material layer 104 ("conformal" as used herein means that the thickness of the gate dielectric 206 is substantially the same on all surfaces, or that the thickness variation is less than 15% of the nominal thickness). In some embodiments, the gate dielectric 206 is $HfO_2$.

Figure 3:
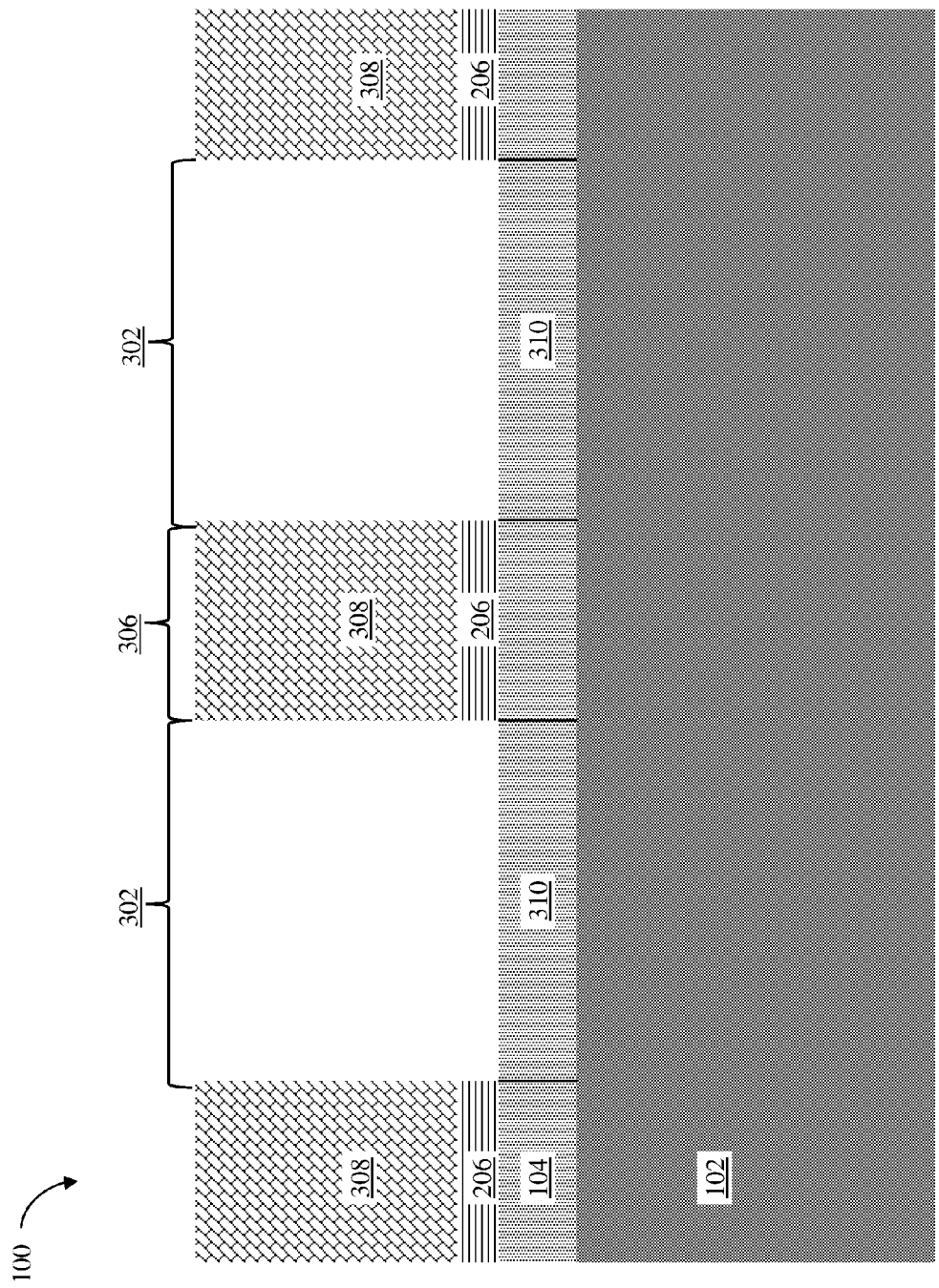
FIG. 3 illustrates a side view following a lithographic patterning and etching process that patterns a mask over portions of the gate dielectric.

FIG. 3 illustrates a side view following a lithographic patterning and etching process that patterns a mask 308 over portions of the gate dielectric 206. Following the patterning of the mask 308, a selective etching process is performed that removes exposed portions of the gate dielectric 206 and exposes portions of the channel material layer 104. The etching process can include, for example, reactive ion etching. In some embodiments, the exposed channel material layer 104 in the cavities 302 can be doped to serve as source/drain regions 310, for example, by ion implantation with n-type dopants (e.g., phosphorus or arsenic) or p-type dopants (e.g., boron or gallium), depending on the type of transistor.

Figure 4:
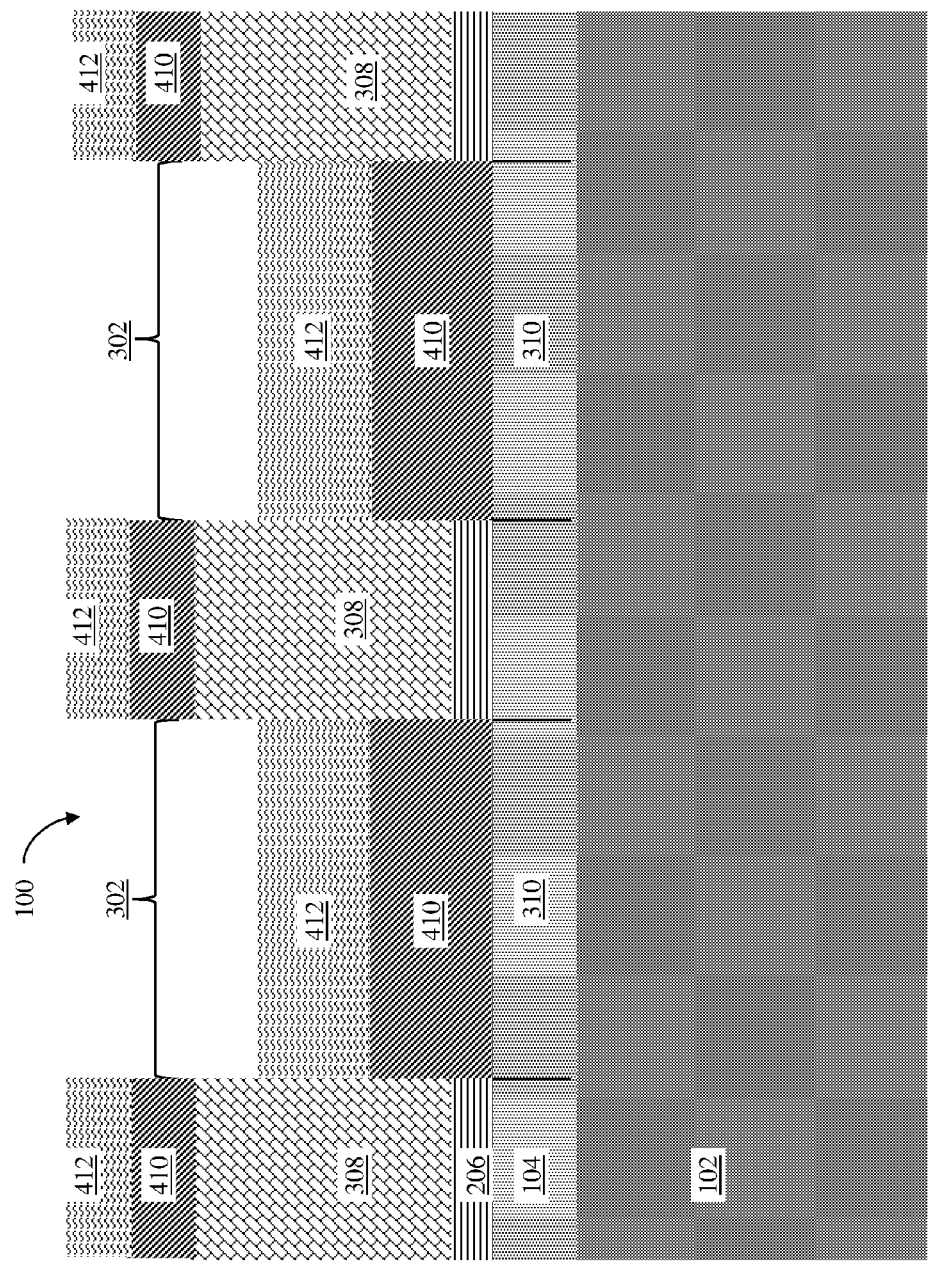
FIG. 4 illustrates a side view of the structure after forming a source/drain contact on the channel material layer and depositing a cap on the source/drain contact within cavities utilizing a photoresist mask.

FIG. 4 illustrates a side view of the structure 100 after forming source/drain contacts 410 on the source/drain regions 310 and depositing a cap 412 on the source/drain contact 410 within the cavities 302 utilizing the photoresist (PR) mask. For ease of illustration and discussion, two source/drain contacts 410 are shown. In the illustrated example, the cap 412 is a polycrystalline silicon (polysilicon) material. Any manner of forming the source/drain contacts 410 can be utilized. In some embodiments, the source/drain contacts are formed using physical vapor deposition (PVD) or chemical vapor deposition (CVD). In some embodiments, the source/drain contacts are epitaxially grown on the on the channel material layer 104. In some embodiments, the source/drain regions 310 is epitaxially grown on the substrate 102. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The source/drain region 310 can be any suitable material, such as, for example, Si, SiGe, Group III-V channel material, or other suitable channel materials. Group III-V channel materials include materials having at least one group III element and at least one group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including at least one of the foregoing materials.

Figure 5:
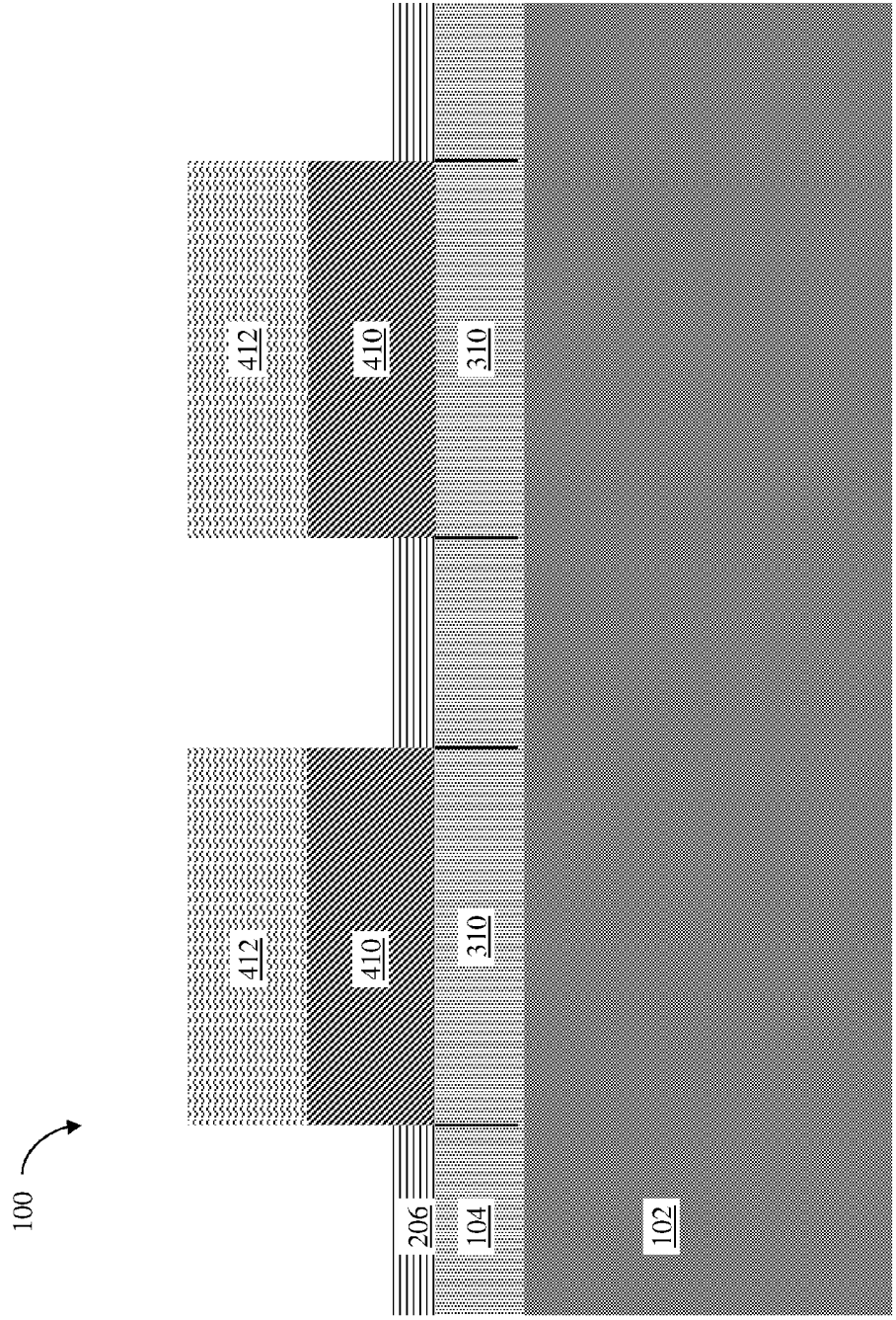
FIG. 5 illustrates a side view after the photoresist mask is removed using a liftoff process.

FIG. 5 illustrates a side view after the photoresist mask is removed along with the portions of source drain contacts 410 and the cap 412 stacks on top of it. The photoresist mask can be removed by, for example, a liftoff process. The liftoff process can be performed using solvents, for example acetone.

Figure 6:
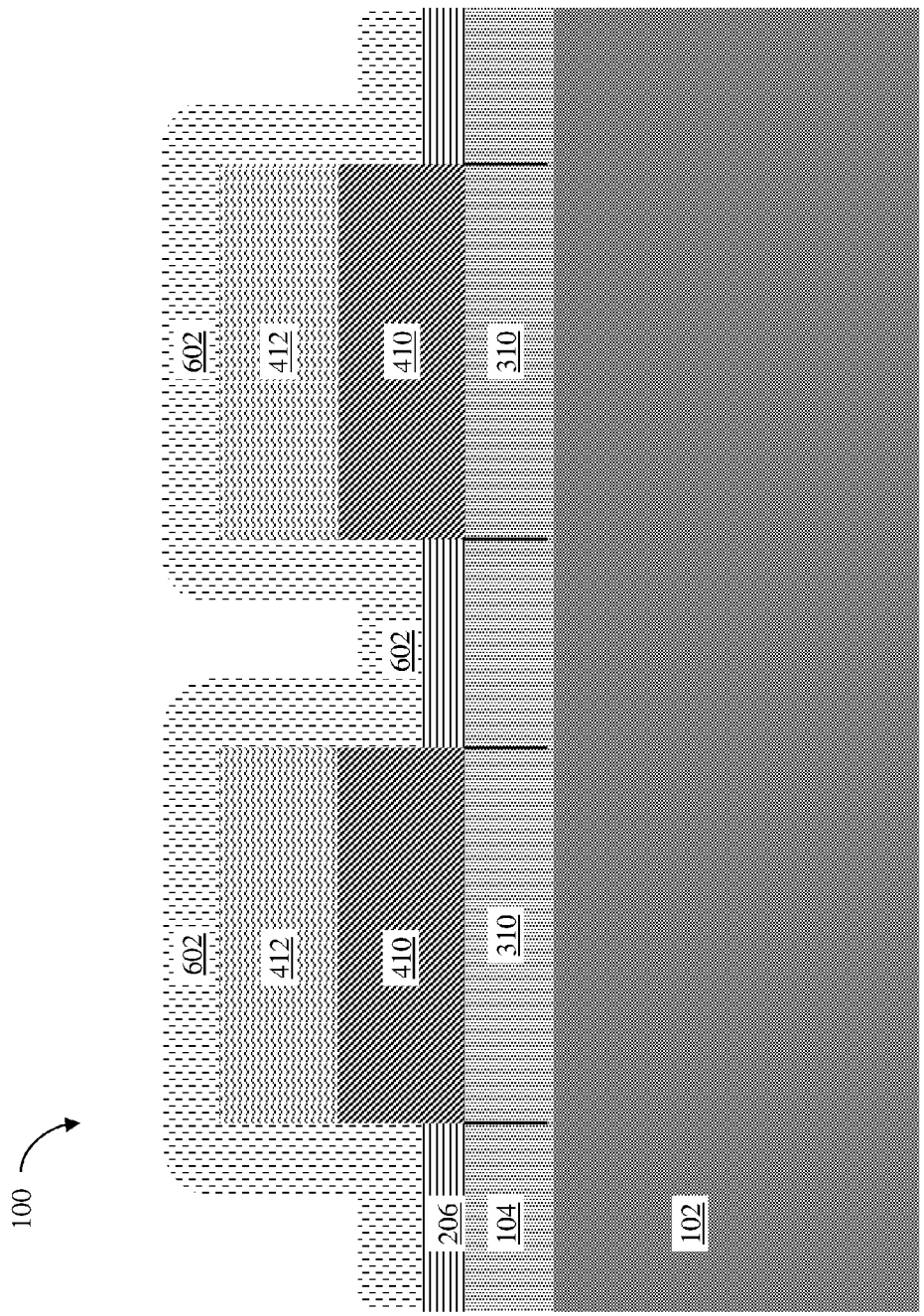
FIG. 6 illustrates a side view after a layer of spacer material is deposited on the exposed portions of the gate dielectric, the source/drain contacts, and the caps.

FIG. 6 illustrates a side view after a layer of spacer material 602 is deposited on the exposed portions of the gate dielectric 206, the source/drain contacts 410, and the caps 412. In the illustrated example, the layer of spacer material 602 is $SiO_2$ and is conformally deposited. However, in some embodiments, the layer of spacer material 602 can be any suitable material such as, for example, dielectric nitrides (e.g., silicon nitride), dielectric oxynitrides, SiBCN, SiOCN, SiOC, dielectric oxides (e.g., silicon oxide), or any combination thereof.

Figure 7:
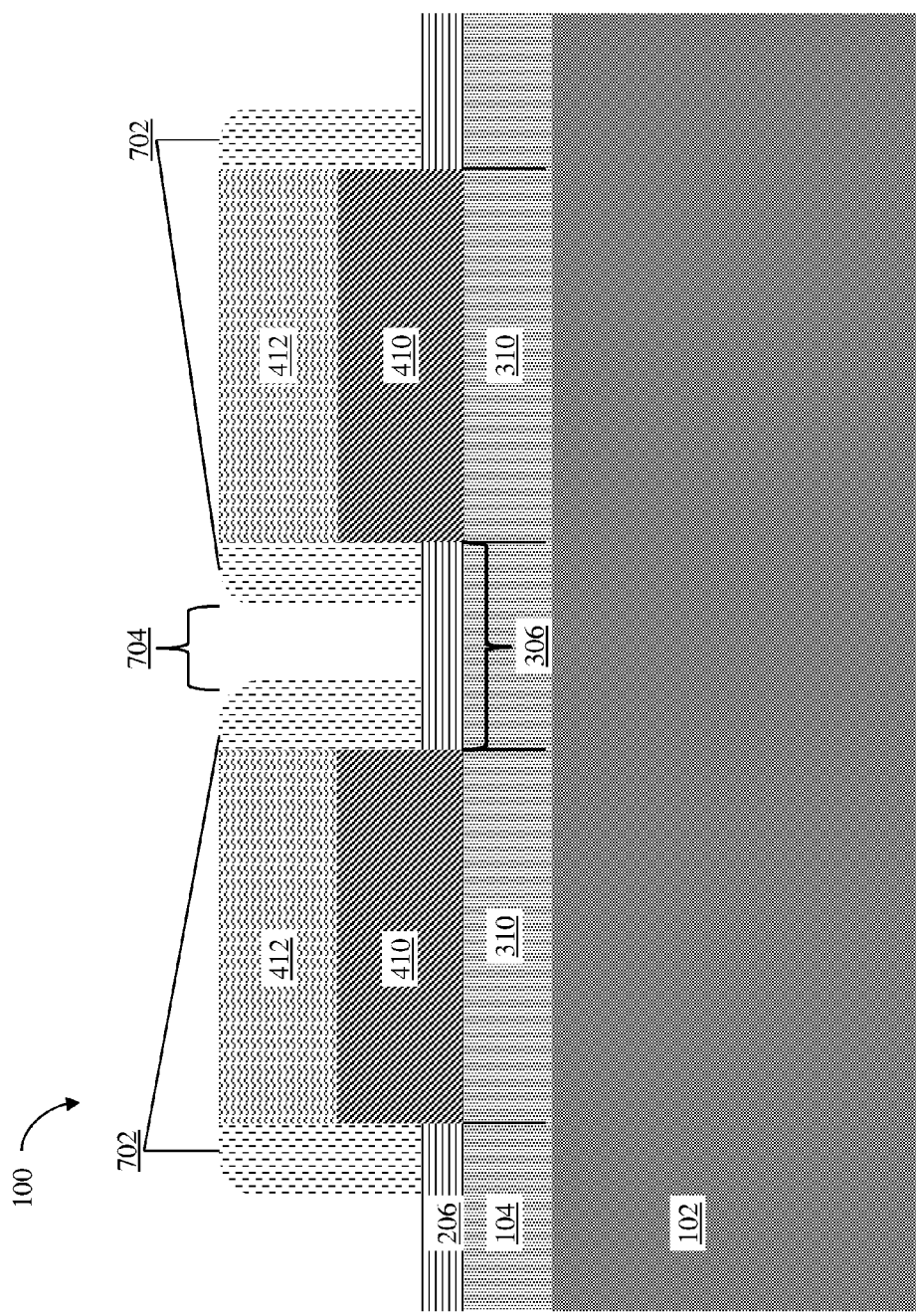
FIG. 7 illustrates a side view of the structure following the performance of an etching process to remove portions of the layer of spacer material to form the sidewall spacers.

FIG. 7 illustrates a side view of the structure 100 following the performance of an etching process to remove portions of the layer of spacer material 602 to form the sidewall spacers 702. Any suitable anisotropic etching process can be used such as, for example, a reactive ion etching process. In some embodiments, an etch process, which can be a wet etch process, a dry etch process or a combination thereof, is utilized. In some embodiments, the etch process is a series of directional etches (e.g., RIEs) having an etch selective to the gate dielectric 206 and the caps 412. This etch reveals a pre-defined trench 704 between two of the sidewall spacers 702. The pre-defined trench 704 and the two sidewall spacers 702 cover the channel length 306.

Figure 8:
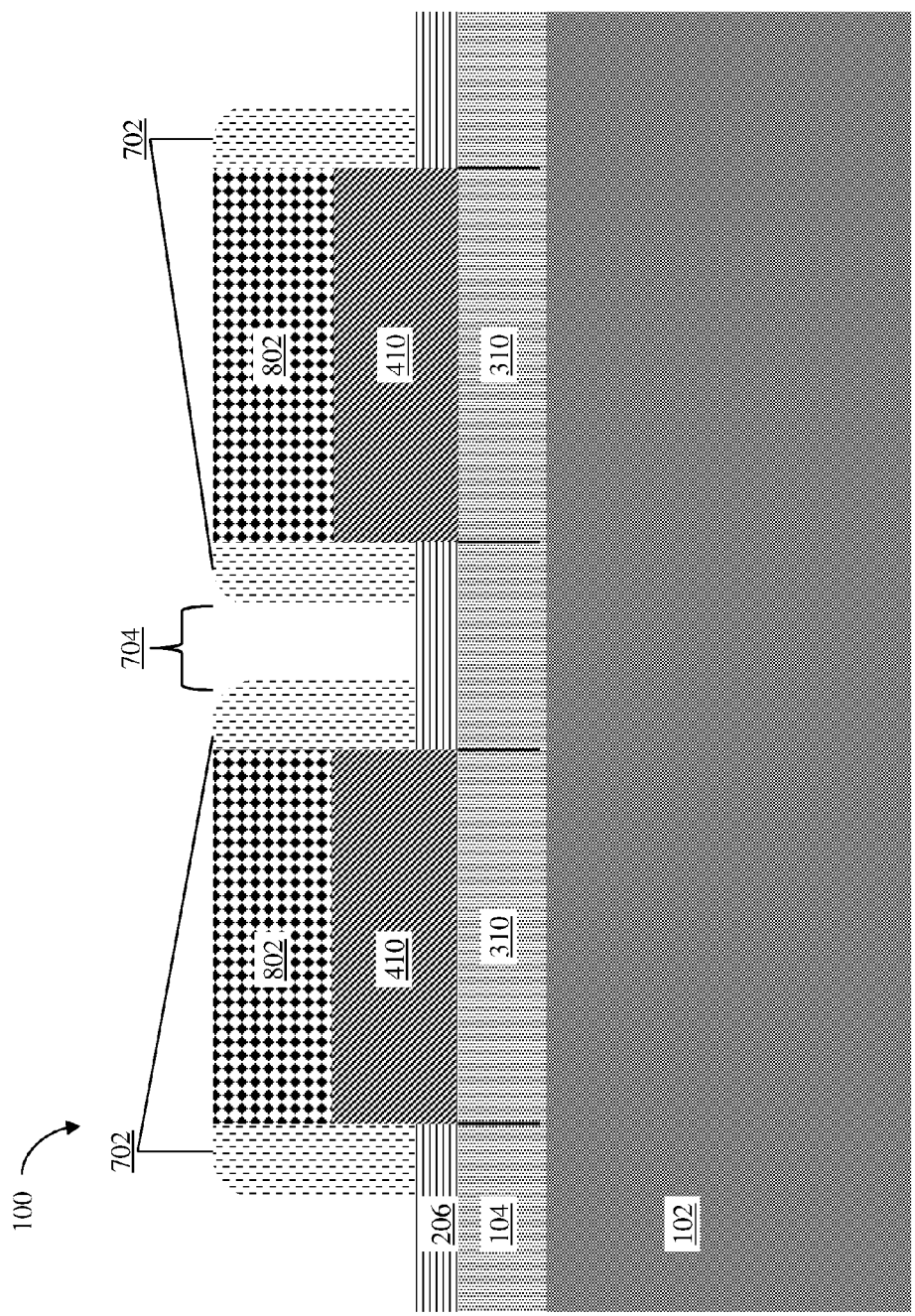
FIG. 8 illustrates a side view following an oxidation process on the caps.

FIG. 8 illustrates a side view following an oxidation process on the caps 412. The illustrated example shows the oxidized regions 802 as being fully oxidized, however, the oxidized regions 802 can be partially oxidized.

Figure 9:
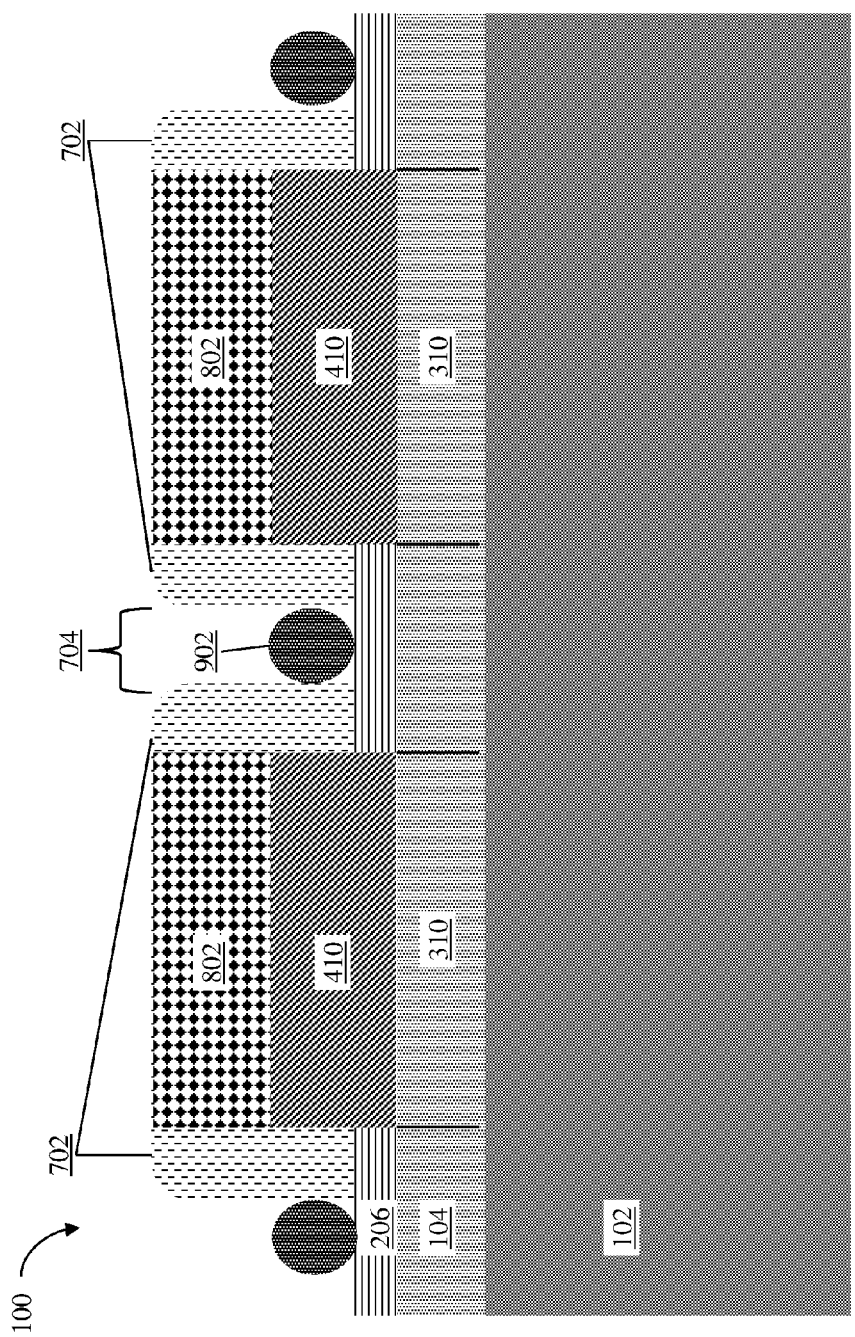
FIG. 9 illustrates a side view of the structure following the depositing of a chemically self-assembled carbon nanotube (CNT) on the exposed portions of the gate dielectric.

FIG. 9 illustrates a side view of the structure 100 following the depositing of a chemically self-assembled carbon nanotube (CNT) 902 on the exposed portions of the gate dielectric 206. In the illustrated example, multiple CNTs are formed on the exposed portions of the gate dielectric in between the spacers 702. The spacers 702 allow for the depositing of the CNTs to be self-aligned within the pre-defined trench 704. Additional etching can remove any unnecessary CNTs. In the chemically self-assembly process, CNTs can be wrapped with a positively charged polymer, while the exposed gate dielectric 206 can be treated with a negatively charged monolayer that selectively bonds to gate dielectric 206 surface but not to the spacers 702 surface. The chemically self-assembly process is accomplished by electrostatic attraction force between the oppositely charged gate dielectric 206 and CNTs. In some embodiments, the gate dielectric is HfO$_2$ or Al$_2$O$_3$, and the spacers are SiO$_2$. The HfO$_2$ or Al$_2$O$_3$ is negatively charged and the CNT is positively charged.

The dimension of the defined trench 704 can be engineered so that a single nanotube can be placed inside the trench as the gate electrode. If multiple nanotubes are placed inside the trench, they can be operated collectively as a single gate or operated separately as multiple gates.

After the self-assembly of the carbon nanotube inside the trench 704, the nanotube can be electrically connected to a gate contact from outside the channel region using another step of lithography and metallization (not shown).

Figure 10:
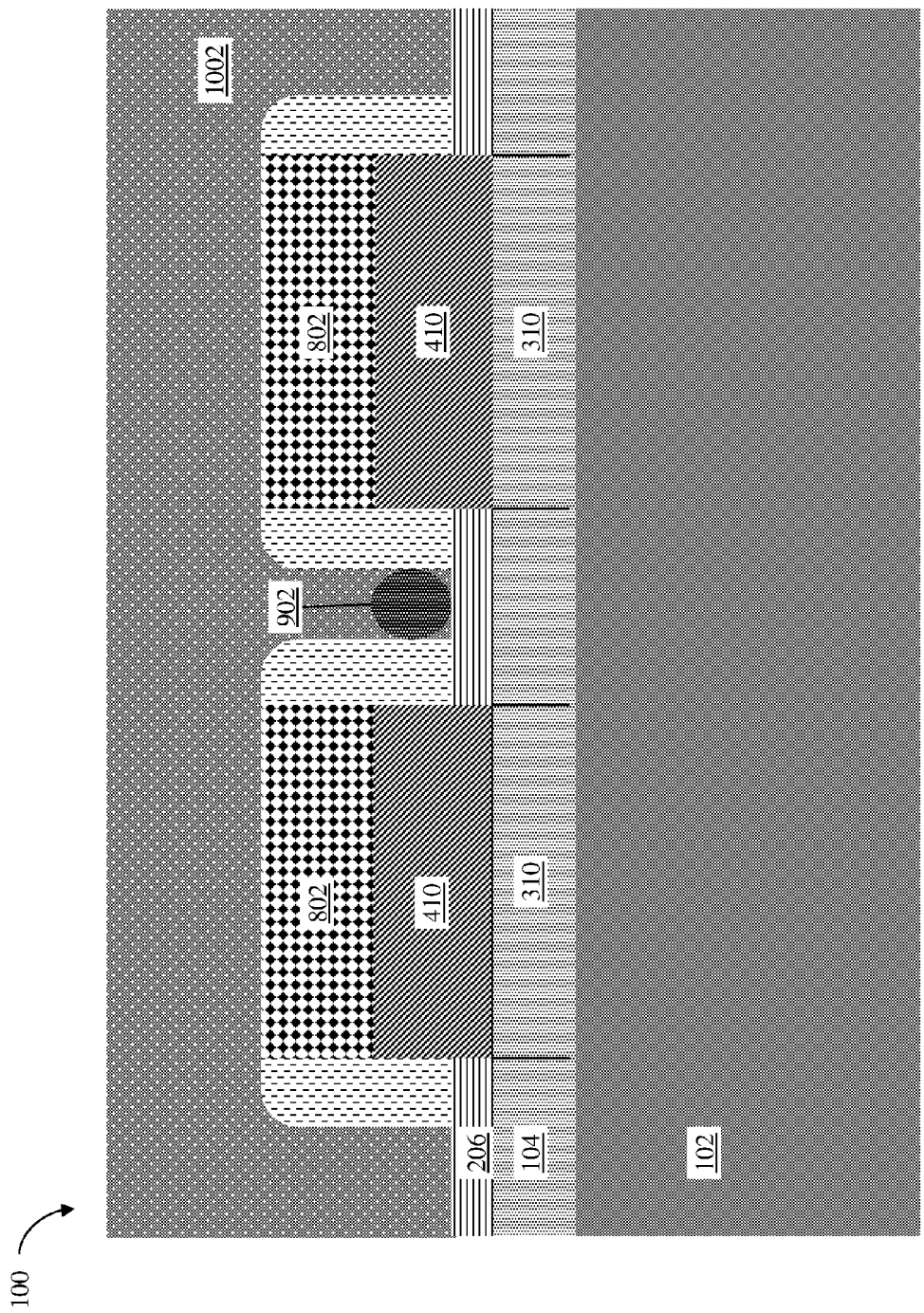
FIG. 10 illustrates a side view following the formation of an inter-level dielectric layer over the CNT, spacers, the oxidized regions, and the exposed portions of the gate dielectric.

FIG. 10 illustrates a side view following the formation of an inter-level dielectric layer 1002 over the CNT 902, spacers 702, the oxidized regions 802, and the exposed portions of the gate dielectric 206.

The inter-level dielectric layer 1002 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1002 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1002, a planarization process such as, for example, chemical mechanical polishing is performed.

Figure 11:
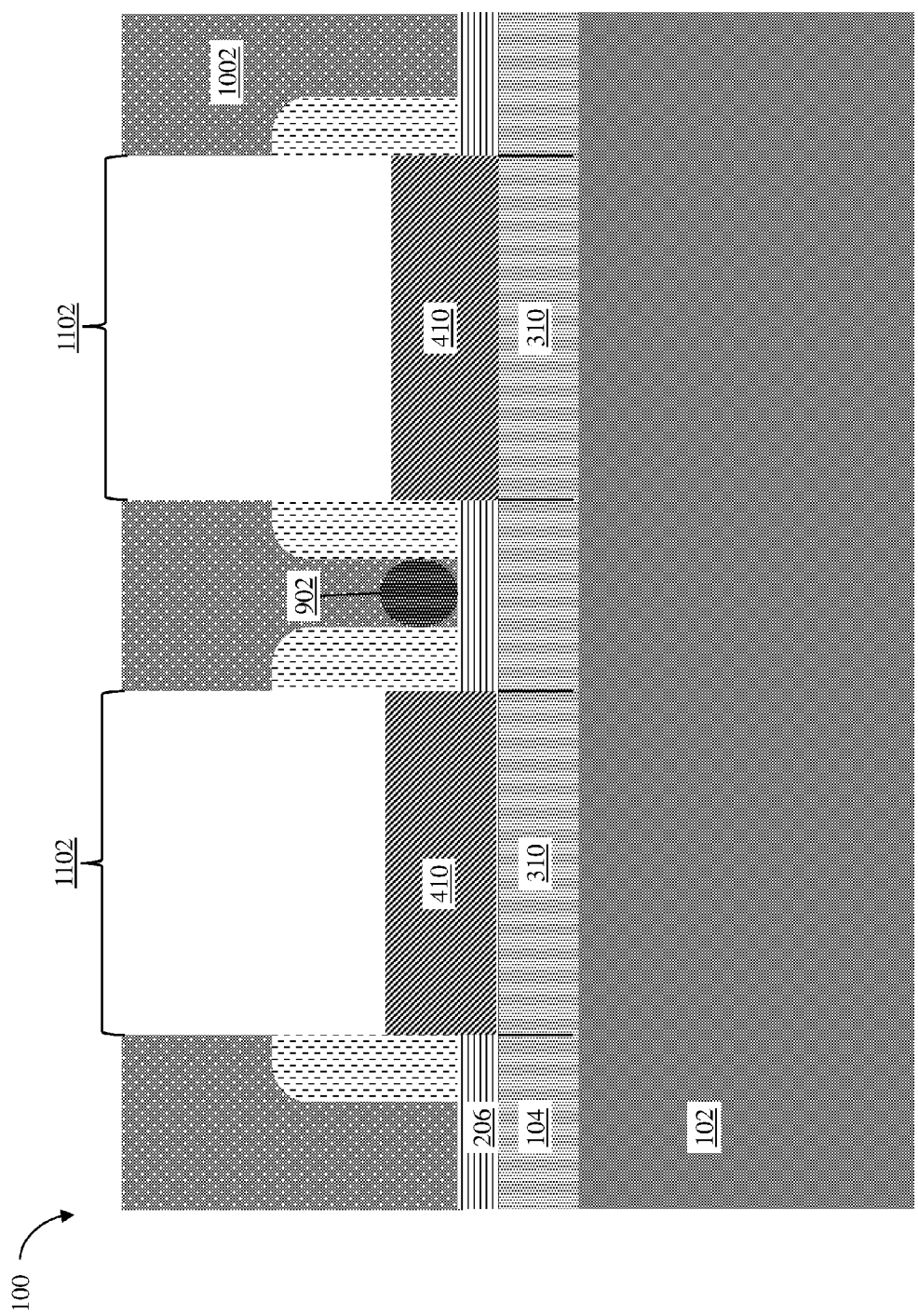
FIG. 11 illustrates a side view following the removal of portions of the inter-level dielectric layer to form cavities that expose portions of the source/drain contacts.

FIG. 11 illustrates a side view following the removal of portions of the inter-level dielectric layer 1002 to form cavities 1102 that expose portions of the source/drain contacts 410. The cavities 1102 can be formed by, for example, a photolithographic patterning and etching process such as reactive ion etching.

Figure 12:
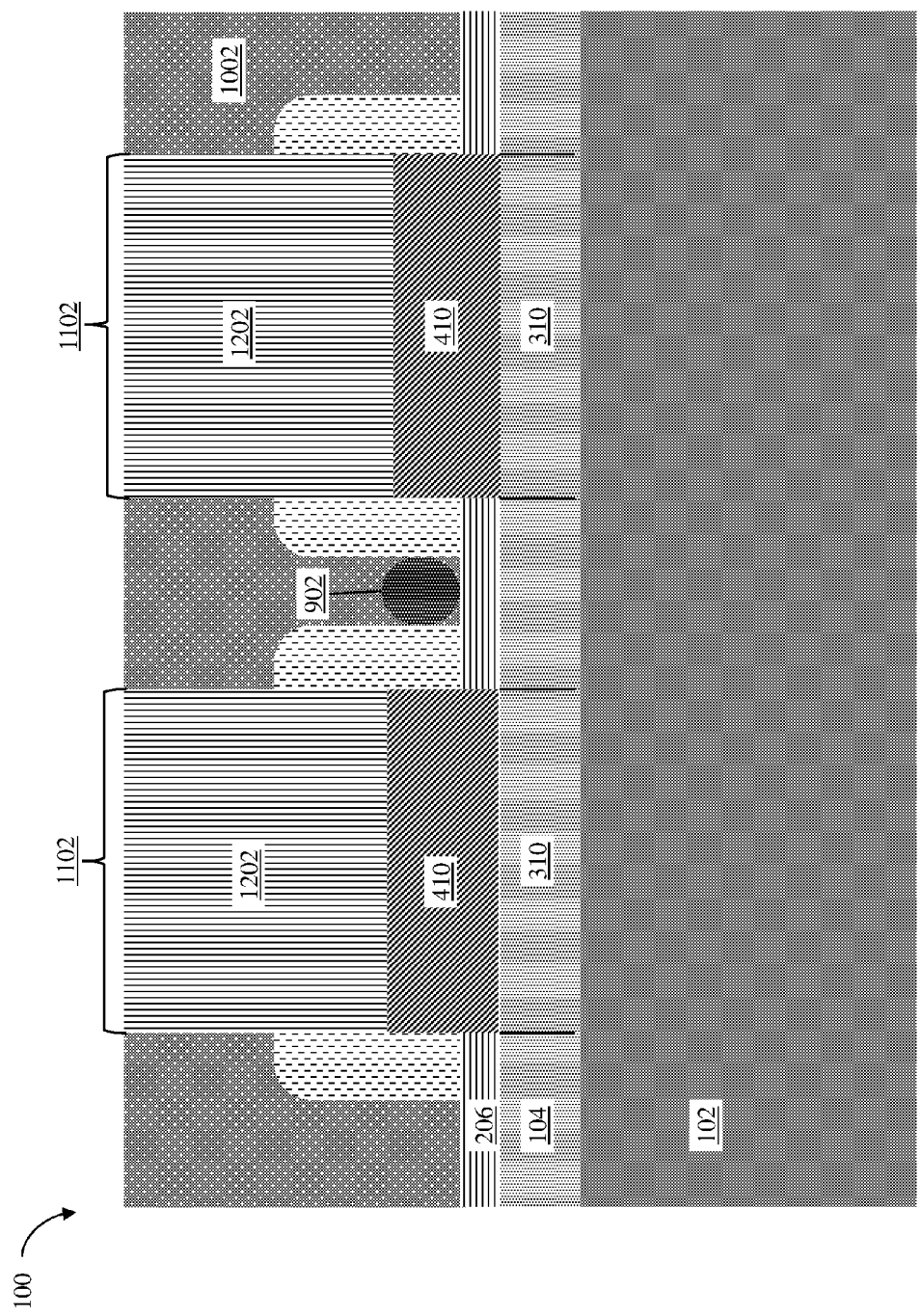
FIG. 12 illustrates a side view of the structure following the deposition of a conductive material in the cavities to form conductive contacts.

FIG. 12 illustrates a side view of the structure 100 following the deposition of a conductive material in the cavities 1102 to form conductive contacts 1202. The conductive contacts 1202 can be formed by, for example, depositing a layer of conductive material in the cavities 1102 and performing a planarization process such as chemical mechanical polishing to form the conductive contacts 1202.

The conductive material can include any suitable conductive material including, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

In some embodiments, silicide regions (not shown) can be formed on the semiconductor regions under source/drain contacts 410. The silicide can be formed by, for example, depositing a metallic material as the source/drain contacts 410, and performing an annealing process that forms the silicide regions.

Technical benefits of the present invention include using chemically self-assembled carbon nanotubes as a gate electrode for field effect transistors, which can be made with various channel materials. A gate length is determined by the diameter of the carbon nanotube which can be as small as ~1 nm. This dimensional scale can hardly be achieved by conventional lithography. The self-aligned nature of the carbon nanotubes can allow for transistors with ultra-short gate lengths and, thus, a greater cut-off frequency can be expected.

As used herein, the terms "invention" or "present invention" are non-limiting terms and not intended to refer to any single aspect of the particular invention but encompass all possible aspects as described in the specification and the claims. The term "on" can refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present. The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a channel layer on a substrate;
   depositing a gate dielectric on the channel layer;
   patterning a mask on the gate dielectric;
   removing an exposed portion of the gate dielectric to expose a first source/drain region and a second source/drain region of the channel layer;
   forming a first source/drain contact on the first source/drain region and a second source/drain contact on the second source/drain region;
   forming a cap layer over the first source/drain contact and the second source/drain contact;
   removing the mask;

forming spacers adjacent to sidewalls of the first source/drain contact and the second source/drain contact;
forming an oxide region in the cap layer; and
depositing a carbon material on an exposed portion of the gate dielectric.

2. The method of claim 1, wherein the forming spacers adjacent to sidewalls of the source/drain contacts comprises:
depositing a layer of spacer material on exposed portions of the gate dielectric, the first source/drain contact, the second source/drain contact, and the cap layer; and
removing portions of the layer of spacer material to form the spacers.

3. The method of claim 2, wherein the spacers are arranged on the gate dielectric.

4. The method of claim 1, wherein the carbon material partially forms a gate stack on the gate dielectric.

5. The method of claim 1, wherein the carbon material includes a carbon nanotube.

6. The method of claim 5, wherein the carbon nanotube is formed by a chemically self-assembled carbon nanotube formation process.

7. The method of claim 1, wherein the gate dielectric comprises $HfO_2$.

8. The method of claim 2, wherein the layer of spacer material comprises an oxide material.

9. The method of claim 1, further comprising: implanting ions on the first source/drain region and the second source/drain region after removing the exposed part of the gate dielectric.

10. A method for forming a semiconductor device, the method comprising:
forming a channel layer on a substrate;
depositing a gate dielectric on the channel layer;
patterning a mask on the gate dielectric;
removing an exposed portion of the gate dielectric to expose a first source/drain region and a second source/drain region of the channel layer;
forming a first source/drain contact on the first source/drain region and a second source/drain contact on the second source/drain region;
forming a cap layer over the first source/drain contact and the second source/drain contact;
removing the mask;
forming spacers adjacent to sidewalls of the first source/drain contact and the second source/drain contact;
forming an oxide region in a portion of the cap layer; and
depositing a carbon material on an exposed portion of the gate dielectric.

11. The method of claim 10, wherein the forming spacers adjacent to sidewalls of the source/drain contacts comprises:
depositing a layer of spacer material on exposed portions of the gate dielectric, the first source/drain contacts, the second source/drain contacts, and the cap layer;
removing portions of the layer of spacer material to form the spacers.

12. The method of claim 10, wherein the carbon material includes a carbon nanotube.

13. The method of claim 12, wherein the carbon nanotube is formed by a chemically self-assembled carbon nanotube formation process.

* * * * *